(12) United States Patent
Chou et al.

(10) Patent No.: US 7,580,262 B2
(45) Date of Patent: Aug. 25, 2009

(54) HEAT DISSIPATION ASSEMBLY FOR GRAPHICS CARD AND BLADE SERVER USING THE SAME

(75) Inventors: Ming-Der Chou, Taipei Hsien (TW); Yao-Tin Chang, Taipei Hsien (TW)

(73) Assignee: Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 58 days.

(21) Appl. No.: 11/967,040

(22) Filed: Dec. 29, 2007

(65) Prior Publication Data

US 2009/0122480 A1 May 14, 2009

(30) Foreign Application Priority Data

Nov. 12, 2007 (CN) .................... 2007 1 0202480

(51) Int. Cl.
*H05K 7/20* (2006.01)
(52) U.S. Cl. .................... 361/700; 361/704; 361/719; 174/15.2; 174/16.1; 174/16.3; 257/715; 165/80.3; 165/80.4; 165/104.26; 165/104.33
(58) Field of Classification Search .................... None
See application file for complete search history.

(56) References Cited

U.S. PATENT DOCUMENTS

| | | | |
|---|---|---|---|
| 6,778,390 B2 * | 8/2004 | Michael | 361/695 |
| 6,871,702 B2 * | 3/2005 | Horng et al. | 165/104.33 |
| 7,283,364 B2 * | 10/2007 | Refai-Ahmed et al. | 361/719 |
| 7,321,494 B2 * | 1/2008 | Han | 361/719 |
| 7,365,989 B2 * | 4/2008 | Peng et al. | 361/720 |
| 7,369,412 B2 * | 5/2008 | Peng et al. | 361/715 |
| 7,382,621 B2 * | 6/2008 | Peng et al. | 361/719 |
| 7,443,672 B2 * | 10/2008 | Peng et al. | 361/695 |
| 7,492,596 B1 * | 2/2009 | Peng et al. | 361/700 |
| 7,495,923 B2 * | 2/2009 | Peng et al. | 361/719 |
| 2009/0080161 A1 * | 3/2009 | Peng et al. | 361/719 |

* cited by examiner

*Primary Examiner*—Boris L Chervinsky
(74) *Attorney, Agent, or Firm*—Frank R. Niranjan

(57) ABSTRACT

A heat dissipation assembly mounted to a main board in a blade server includes a graphics card, a heat sink, and a thermal board. The graphics card includes a GPU and a plurality of first graphics memory chips mounted on a top thereof, and a plurality of second graphics memory chips mounted on a bottom thereof. The heat sink for cooling the GPU and the first graphics memory chips, includes a base attached to the top of the graphics card, a finned part fixed to a top of the base, and a heat pipe sandwiched between the base and the finned part. A pathway of the heat pipe passes over the GPU and at least part of the first graphics memory chips of the graphics card. The thermal board is mounted to the bottom of the graphics card for cooling the second graphics memory chips.

18 Claims, 4 Drawing Sheets

HEAT DISSIPATION ASSEMBLY FOR GRAPHICS CARD AND BLADE SERVER USING THE SAME

BACKGROUND

1. Field of the Invention

The present invention relates to heat dissipation assemblies, and more particularly to a heat dissipation assembly for a graphics card.

2. Description of Related Art

As information technology has rapidly progressed, computers that can handle information efficiently, especially the servers, have become increasingly important to society.

In recent years, the number of electronic components in a server continually increase to achieve high performance while space that the server occupies remains the same or is even reduced. Thus, density of the components in the server is increased, which leads to growing heat dissipation problems.

In a blade server, because space between two adjacent blades is narrow, a graphics card is typically mounted parallel to a main board of each blade. A plurality of electronic components, such as graphics memory chips, is set on both sides of the graphics card to achieve high performance, which increases heat production of the graphics card. Moreover, airflow in the server, meant to cool all the components therein, is usually heated by central processor units (CPU) of the main board before it gets to the graphics card, meaning the graphics card may not be cooled efficiently.

What is needed, therefore, is a heat dissipation assembly that alleviates the above-mentioned problem.

SUMMARY

An exemplary heat dissipation assembly mounted to a main board in a blade server includes a graphics card, a heat sink mounted to a top of the graphics card, and a thermal board mounted to a bottom of the graphics card. The graphics card includes a GPU and a plurality of first graphics memory chips mounted on the top thereof, and a plurality of second graphics memory chips mounted on the bottom thereof. The heat sink for cooling the GPU and the first graphics memory chips, includes a base attached to the top of the graphics card, a finned part fixed to a top of the base, and a heat pipe sandwiched between the base and the finned part. A pathway of the heat pipe passes over the GPU and at least part of the first graphics memory chips of the graphics card. The thermal board is used for cooling the second graphics memory chips.

Other advantages and novel features of the present invention will become more apparent from the following detailed description of an embodiment when taken in conjunction with the accompanying drawings, in which:

DETAILED DESCRIPTION

Figure 1:
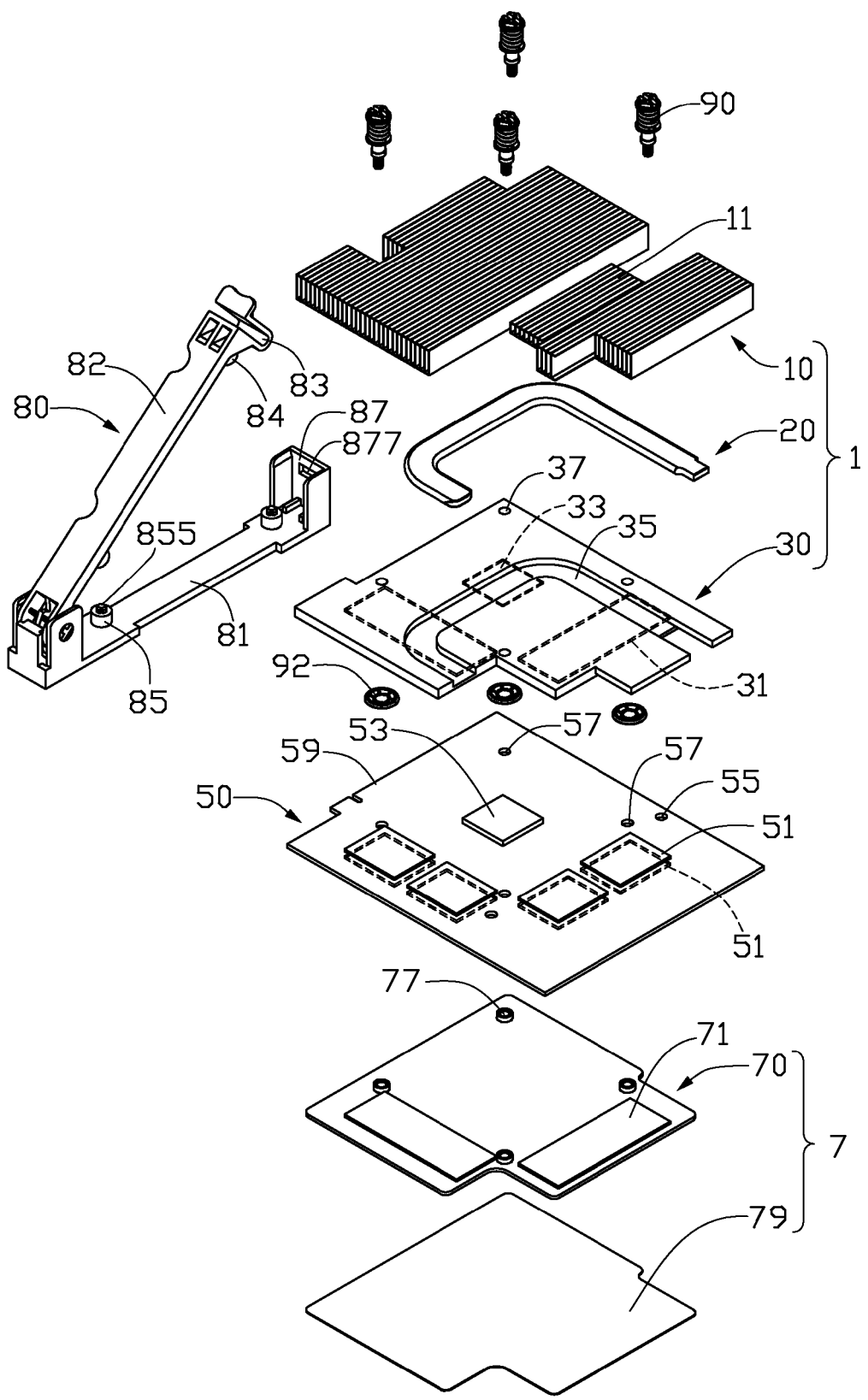
FIG. 1 is an exploded, isometric view of a heat dissipation assembly in accordance with an embodiment of the present invention.

Referring to FIG. 1, a heat dissipation assembly in accordance with an embodiment of the present invention includes a graphics card 50, a heat sink 1 attached to a top of the graphics card 50, a back board 7 attached to a bottom of the graphics card 50, and a fixing member 80.

The graphics card 50 includes a graphic processing unit (GPU) 53 and a plurality of graphics memory chips 51 set thereon. In the embodiment, there are eight graphics memory chips 51. The GPU 53 and four of the chips 51 are set on the top of the graphics card 50. The GPU 53 is located on a center portion of the graphics card 50, the four of the chips 51 are placed around the GPU 53 in pairs at two adjoining sides of the GPU 53 respectively. The remaining four of the chips 51 are set on the bottom of the graphics card 50 correspondingly under the four of the chips 51 on the top of the graphics card 50. Four first holes 57 are defined in the graphics card 50 around the GPU 53. The first holes 57 cooperatively define a square area, the GPU 53 is located at the center of the square area, and the chips 51 are located out of the square area. Two second holes 55 are defined in the graphics card 50 respectively adjacent two of the first holes 57 and out of the square. An inserting portion 59 extends from an end of the graphics card 50 adjacent the other two of the first holes 57.

The heat sink 1 is mounted to the top of the graphics card 50 for dissipating heat for elements on the top of the graphics card 50 such as the GPU 53 and the chips 51. The heat sink 1 includes a base 30 attached to the graphics card 50, a finned part 10 fixed to a top of the base 30, and a U-shaped heat pipe 20 sandwiched between the base 30 and the finned part 10. Thermal grease 33 is applied to a bottom of the base 30 corresponding to the GPU 53 of the graphics card 50. Two thermal pads 31 are attached to the bottom of the base 30 over the chips 51 on the top of the graphics card 50, and each thermal pad 31 corresponds to one of the pairs of chips 51 at one of the sides of the GPU 53. A U-shaped groove 35 is defined in the top of the base 30 for receiving the U-shaped heat pipe 20. A pathway of the groove 35 passes over the thermal grease 33 and the two thermal pads 31 of the base 30. Four holes 37 are defined in the base 30 corresponding to the first holes 57 of the graphics card 50. The finned part 10 includes a plurality of parallel fins extending therefrom and a groove 11 defined therein. The heat sink 1 is flat to suit a narrow space, and the finned part 10 fully covers the base 30 to achieve a desired purpose of cooling the elements on the top of the graphics card 50. The thermal grease 33 and the thermal pads 31 are used to help transmit heat from the GPU 53 and the chips 51 on the top of the graphics card 50 to the heat sink 1. The heat pipe 20 is used to enhance heat exchange between the graphics card 50 and the heat sink 1, and especially, because of the pathway of the heat pipe 20, the heat pipe 20 can conduct heat from the GPU 53 and the chips 51 to the finned part 10 of the heat sink 1 to efficiently cool the GPU 53 and the chips 51 on the top of the graphics card 50.

The back board 7 includes a thermal board 70 attached to the bottom of the graphics card 50 for dissipating heat from elements on the bottom of the graphics card 50 such as the four remaining chips 51, and an electrically insulating piece 79 fixed to a bottom of the thermal board 70. Two thermal pads 71 are attached to a top of the thermal board 70 under the chips 51 on the bottom of the graphics card 50, and each thermal pad 71 corresponds to two of the chips 51 at one of the side of the GPU 53. The thermal board 70 includes four posts, and each post defines a screw hole 77. The screw holes 77 correspond to the first holes 57 of the graphics card 50 respectively. The thermal board 70 is used to achieve a desired purpose of cooling the elements on the bottom of the graphics card 50. The thermal pads 71 are used to help transmit heat from the chips 51 on the bottom of the graphics card 50 to the heat sink 1. The posts of the thermal board 70 are used to define a space between the thermal board 70 and the graphics card 50 for receiving the elements on the bottom of the graphics card 50. The insulating piece 79 is use to prevent elements of a main board 100 (see FIG. 4) from being electrically influenced by the present heat dissipation assembly, when the heat dissipation assembly is mounted on the main board 100.

The fixing member 80 includes a fixed part 81, and a rotating part 82 rotatably mounted to the fixed part 81. A first end of the rotating part 82 is rotatably connected to a first end of the fixed part 81. The fixed part 81 includes two supporting posts 85 extending from a top side thereof corresponding to the second holes 55 of the graphics card 50, and a wall 87 perpendicularly extending upward from a second end thereof. A cross-shaped clipping block 855 extends from a top of each supporting posts 85. A rectangular hole 877 is defined in the wall 87. The rotating part 82 includes two pressing posts 84 extending from a bottom side thereof corresponding to the supporting posts 85 of the fixed part 81, and a U-shaped elastic member 83 extending from a second end thereof. A clipping block 833 (see FIG. 3) extends from an outer side of the elastic member 83 corresponding to the hole 877 of the wall 87 of the fixed part 81. When the rotating part 82 is rotated to a clipping position, the clipping block 83 of the rotating part 8 is snappingly clipped in the hole 877 of fixed part 81. When the U-shaped elastic member 83 is pressed to be elastically deformed, the clipping block 83 of the rotating part 8 is disengaged from the hole 877 of fixed part 81, such that the rotating part 82 can be rotated away from the clipping position.

Figure 2:
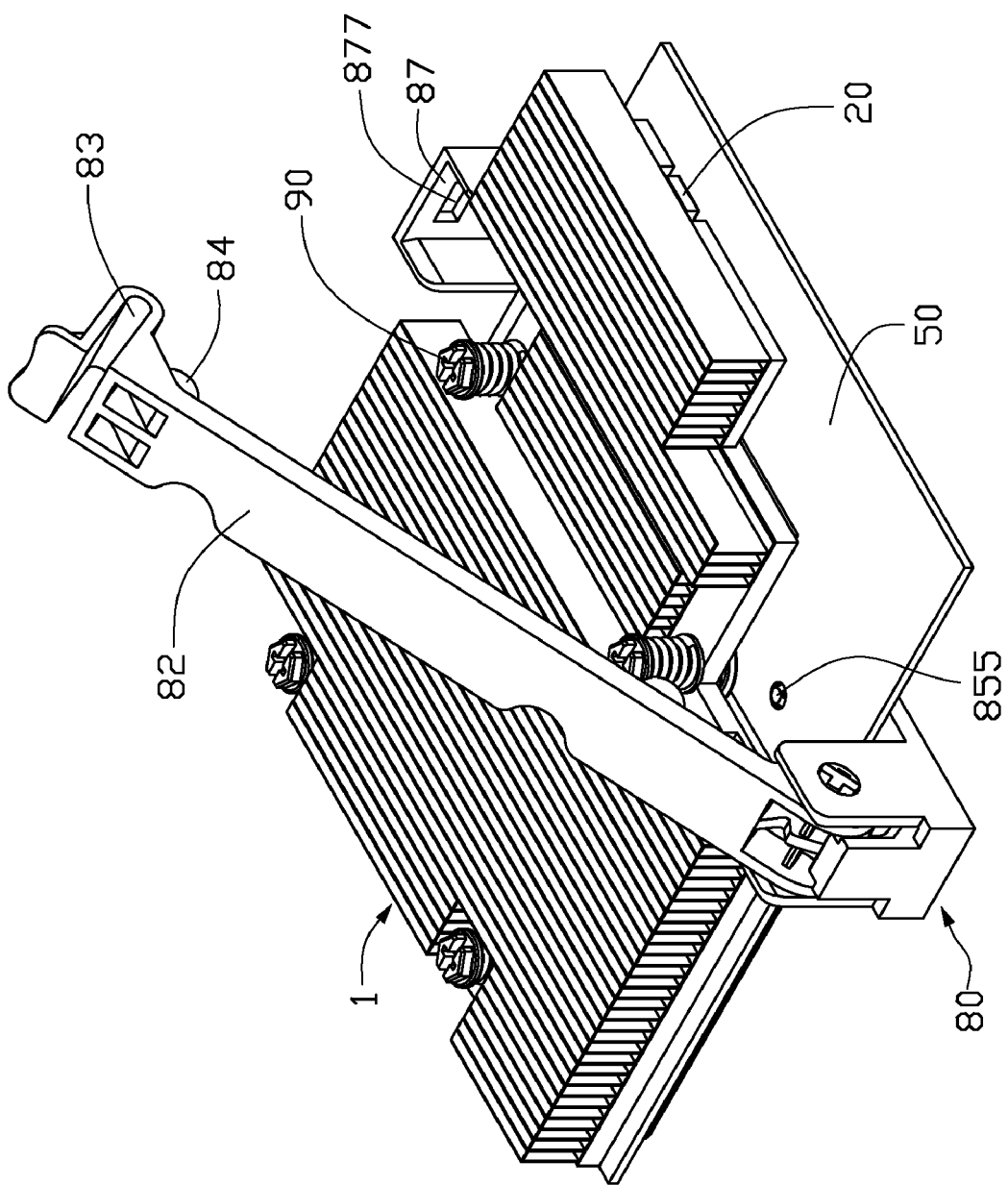
FIG. 2 an assembled, isometric view of FIG. 1.
Figure 3:
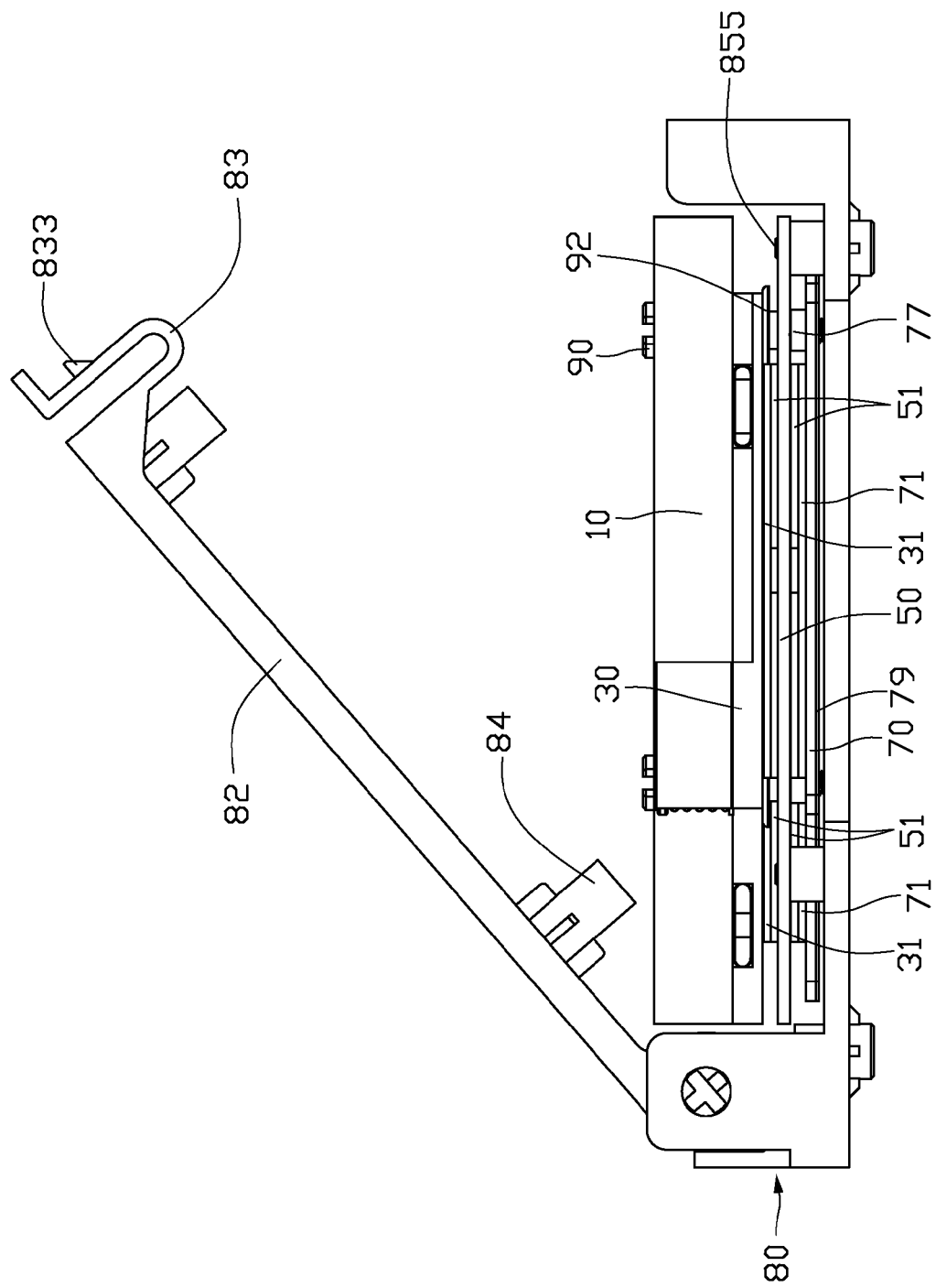
FIG. 3 is a front, elevational view of FIG. 2.

Referring also to FIGS. 2 and 3, in assembly, ends of four spring-loaded screws 90 are respectively inserted through the holes 37 of the heat sink 1, the corresponding first holes 57 of the graphics card 50, and engaged in the corresponding holes 77 of the back board 7, in order to assemble the heat sink 1, the graphics card 50, and the back board 7 together. Thus, the thermal grease 33 of the heat sink 1 contacts with the GPU 53 of the graphics card 50, the thermal pads 31, 71 of the heat sink 1 and the back board 7 contact with the corresponding chips 51 of the graphics card 50. The heat pipe 20 of the heat sink 1 absorbs heat generated by the GPU 53, and the corresponding chips 51 of the graphics card 50, and the heat is rapidly and evenly distributed throughout its whole body and then sends the heat to the finned part 10 of the heat sink 1. It is noted that in the embodiment, the pathway of the heat pipe 20 passes over the GPU 53 and partly over the chips 51, which achieves the desired purpose of heat dissipation, especially a desired purpose of cooling the GPU 53, and is based on a consideration of cost. In other embodiments, the pathway of the heat pipe 20 may pass over all of the GPU 53 and the chips 51. Moreover, in order to make sure that a space for receiving the elements on the top of the graphics cards 50 can be formed, four elastic washers 92 (see FIG. 1) are sandwiched between the heat sink 1 and the graphics cards 50 respectively corresponding to the first holes 57 of the graphics cards 50, and engaged with the corresponding screws 90.

Figure 4:
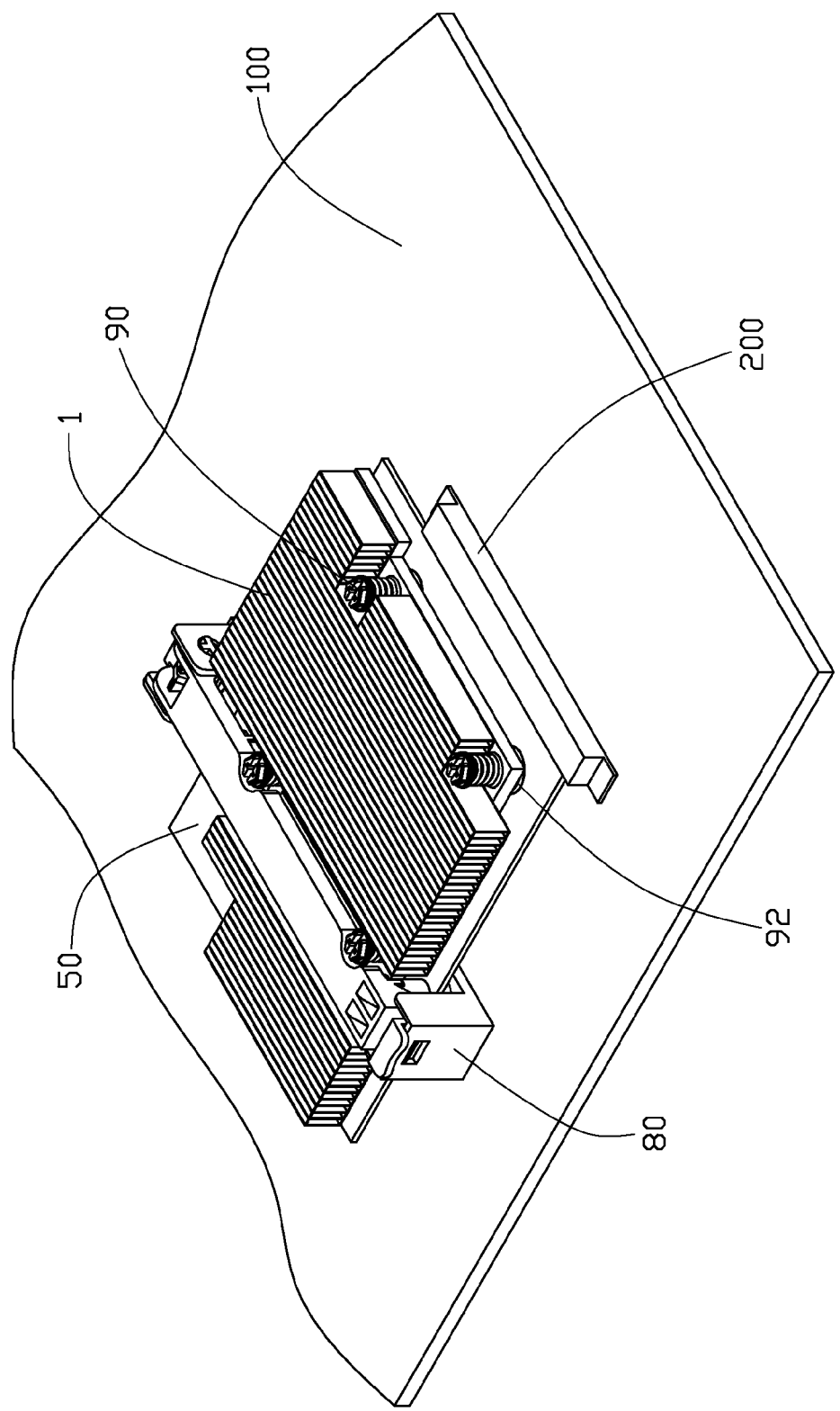
FIG. 4 is an isometric view of the heat dissipation assembly of FIG. 2 mounted on a main board.

Referring also to FIG. 4, in use, the fixing member 80 is fixed to a desired position of the main board 100 and parallel to a socket 200 of the main board 100. In the embodiment, the main board 100 is a main board of a blade server. The inserting portion 59 of the graphics card 50 of the heat dissipation assembly is inserted in the socket 200 of the main board 100. The clipping blocks 855 of the fixed part 81 of the fixing member 80 are respectively engaged in the corresponding second holes 55 of the graphics card 50, and the graphics card 50 is supported on the supporting posts 85 of the fixed part 81 of the fixing member 80. The rotating part 82 of the fixing member 80 is rotated to the fixing position, partly received in the groove 11 of the heat sink 1, and secured to the fixed part 81 of the fixing member 80, such that the pressing posts of the rotating part 82 of the fixing member 80 abut against the corresponding clipping blocks 855 of the fixed part 81 of the fixing member 80. Thus, the heat dissipation assembly is fixed to the main board 100 securely.

The present heat dissipation assembly can achieve good heat dissipation for graphics cards in a blade server, and costs less than a typical heat dissipation assembly used in a server.

It is to be understood, however, that even though numerous characteristics and advantages of the present invention have been set forth in the foregoing description, together with details of the structure and function of the invention, the disclosure is illustrative only, and changes may be made in detail, especially in matters of shape, size, and arrangement of parts within the principles of the invention to the full extent indicated by the broad general meaning of the terms in which the appended claims are expressed.

What is claimed is:

1. A heat dissipation assembly mounted to a main board, the heat dissipation assembly comprising:
    a graphics card comprising a graphic processing unit (GPU) and a plurality of first graphics memory chips mounted on a top thereof, and a plurality of second graphics memory chips mounted on a bottom thereof;
    a heat sink mounted to the top of the graphics card for cooling the GPU and the first graphics memory chips of the graphics card, the heat sink comprising a base attached to the top of the graphics card, a finned part having a plurality of fins fixed to a top of the base, and a heat pipe sandwiched between the base and the finned part, a pathway of the heat pipe passing over the GPU and at least part of the first graphics memory chips of the graphics card; and
    a thermal board mounted to a bottom of the graphics card for cooling the second graphics memory chips of the graphics card.

2. The heat dissipation assembly as claimed in claim 1, wherein thermal grease is attached to the bottom of the base of the heat sink and contacts with the GPU of the graphics card.

3. The heat dissipation assembly as claimed in claim 1, wherein a plurality of thermal pads is attached to the bottom of the base of the heat sink and respectively contacts with the first graphics memory chips of the graphics card.

4. The heat dissipation assembly as claimed in claim 1, wherein a plurality of thermal pads is attached to a top of the thermal board and respectively contacts with the second graphics memory chips of the graphics card.

5. The heat dissipation assembly as claimed in claim 1, wherein four of the first graphics memory chips are mounted to the top of the graphics card, the first graphics memory chips are in pairs set at two adjoined sides of the GPU respectively, a thermal pad is attached to a bottom of the base of the heat sink and contacts each of the pairs of first graphics memory chips.

6. The heat dissipation assembly as claimed in claim 5, wherein four of the second graphics memory chips are mounted to the bottom of the graphics card, the second graphics memory chips are in pairs set at two adjoined sides of the GPU respectively, a thermal pad is attached to a top of the thermal board and contacts each of the pairs of second graphics memory chips.

7. The heat dissipation assembly as claimed in claim 6, wherein the second graphics memory chips on the bottom of the graphics card are respectively under the first graphics memory chips on the top of the graphics card.

8. The heat dissipation assembly as claimed in claim 1, wherein an insulating piece is fixed to a bottom of the thermal board configured to prevent elements of the main board from being electrically disturbed by the heat dissipation assembly.

9. The heat dissipation assembly mounted to a main board comprising:
   the heat dissipation assembly mounted to the main board, wherein the heat dissipation assembly comprises:
   a graphics card mounted to and in parallel with the main board, the graphics card comprising a graphic processing unit (GPU) and a plurality of first graphics memory chips mounted on a top thereof, and a plurality of second graphics memory chips mounted on a bottom thereof;
   a heat sink mounted to the top of the graphics card for cooling the GPU and the first graphics memory chips of the graphics card, the heat sink comprising a base attached to the top of the graphics card, a finned part having a plurality of fins fixed to a top of the base, and a heat pipe sandwiched between the base and the finned part, a pathway of the heat pipe passing over the GPU and at least part of the first graphics memory chips of the graphics card; and
   a thermal board mounted to a bottom of the graphics card for cooling the second graphics memory chips of the graphics card.

10. The heat dissipation assembly as claimed in claim 9, wherein thermal grease is attached to the bottom of the base of the heat sink and contacts with the GPU of the graphics card.

11. The heat dissipation assembly as claimed in claim 9, wherein a plurality of thermal pads is attached to the bottom of the base of the heat sink and respectively contacts with the first graphics memory chips of the graphics card.

12. The heat dissipation assembly as claimed in claim 9, wherein a plurality of thermal pads is attached to a top of the thermal board and respectively contacts with the second graphics memory chips of the graphics card.

13. The heat dissipation assembly as claimed in claim 9, wherein the four pieces of the first graphics memory chips are mounted to the top of the graphics card, the first graphics memory chips are in pairs set at two adjoined sides of the GPU respectively, a thermal pad is attached to a bottom of the base of the heat sink and contacts each of the pairs of first graphics memory chips.

14. The heat dissipation assembly as claimed in claim 13, wherein four of the second graphics memory chips are mounted to the bottom of the graphics card, the second graphics memory chips are in pairs set at two adjoined sides of the GPU respectively, a piece of thermal pad is attached to a top of the thermal board and contacts each of the pairs of second graphics memory chips.

15. The heat dissipation assembly as claimed in claim 14, wherein the second graphics memory chips on the bottom of the graphics card are respectively under the first graphics memory chips on the top of the graphics card.

16. The heat dissipation assembly as claimed in claim 9, wherein an insulating piece is fixed to a bottom of the thermal board configured to prevent elements of the main board from being electrically disturbed by the heat dissipation assembly.

17. The heat dissipation assembly as claimed in claim 9, further comprising a fixing member for clipping the heat dissipation assembly, wherein the fixing member comprises a fixed part fixed to the main board, and a rotating part mounted to the fixing part, a first end of the rotating part is rotatably connected to a first end of the fixing part, a wall defining a hole extends from a second end of the fixing part, an elastic member extends from a second end of the rotating part, a groove is defined in a top of the finned part of the heat sink, when the rotating part of the fixing member is rotated to a fixing position, the rotating part is partly received in the groove of the heat sink, the clipping block of the rotating part is snappingly clipped in the hole of fixing part, and when the elastic member is operated to be elastically deformed, the clipping block of the rotating part is disengaged from the hole of fixing part, and the rotating part can be rotated away from the clipping position.

18. The heat dissipation assembly as claimed in claim 17, wherein the fixed part of the fixing member comprises two supporting posts extending therefrom, a cross-shaped clipping block extends from each of the supporting posts, two holes are defined in the graphics card, the cross-shaped clipping blocks of the fixed part of the fixing member are respectively engaged in the holes of the graphics card.

* * * * *